United States Patent [19]

Masuda et al.

[11] Patent Number: 4,600,916
[45] Date of Patent: Jul. 15, 1986

[54] PARALLEL ANALOG-TO-DIGITAL CONVERTER CIRCUIT

[75] Inventors: Eiji Masuda, Kawasaki; Kenji Matsuo, Yokohama; Yasuhiko Fujita, Tokyo, all of Japan

[73] Assignee: Tokyo Shibaura Denki Kabushiki Kaisha, Japan

[21] Appl. No.: 487,131

[22] Filed: Apr. 21, 1983

[30] Foreign Application Priority Data

Apr. 22, 1982 [JP] Japan ................................. 57-67942

[51] Int. Cl.⁴ .......................................... H03K 13/02
[52] U.S. Cl. ................................ 340/347 AD; 371/57
[58] Field of Search .................... 340/347 AD; 371/57

[56] References Cited

U.S. PATENT DOCUMENTS 3,940,571  2/1976  Ashley ................................... 371/57
4,020,460  4/1977  Jones et al. ............................. 371/57
4,216,460  8/1980  Baldwin et al. ......................... 371/57
4,481,629  11/1984 Hatata et al. .................... 340/347 AD

OTHER PUBLICATIONS

Dingwall, "Monolithic Expandible 6 Bit 20 MHz CMOS/SOS A/D Converter," IEEE J. Solid–State Circuits, vol. SC-14, pp. 926–932, Dec. 1979.

Primary Examiner—Clifford C. Shaw
Attorney, Agent, or Firm—Finnegan, Henderson, Farabow, Garrett & Dunner

[57] ABSTRACT

A parallel analog-to-digital converter circuit comprises a plurality of level comparator circuits and a plurality of detectors. The level comparator circuits compare the level of one analog input signal with a plurality of reference levels. Any two or more level comparator circuits which receive consecutive reference levels from one set. Each of the detectors determines whether or not the output signals from the level comparator circuits of one set are in a specified state. According to the number of sets of level comparator circuits whose output signals are detected to be in the specified state, it is determined whether or not the analog-to-digital converter circuit functions correctly. the upper limit of the speed of analog-to-digital conversion can be determined according to this number of sets.

1 Claim, 6 Drawing Figures

PARALLEL ANALOG-TO-DIGITAL CONVERTER CIRCUIT

BACKGROUND OF THE INVENTION

This invention relates to a parallel analog-to-digital converter circuit which has an erroneous-operation detecting function and which is suitable for embodiment of semiconductor integrated circuit.

When it is desired to convert an analog signal, such as video signal or the like having a relatively high frequency, into a digital signal, a high speed analog-to-digital converter (hereinafter referred to as an A/D converter) is used.

FIG. 1 is a view showing the construction of a prior art parallel A/D converter circuit suitable for subjecting an analog signal such as a video signal or the like having a high frequency to A/D conversion. In this A/D converter circuit, between a point of applying a reference voltage $+V_{REF}$ of positive polarity and a point of applying a reference voltage $-V_{REF}$ of negative polarity, a plurality of resistors I are connected in series, and so a different reference level signal is obtained from the point of serial connection between each pair of any two adjacent resistors I. The reference level signal is supplied, jointly with the analog signal IN, to each of a plurality of level comparator circuits $10_1$ to $10_i$, each consisting of an autozero type comparator, in which the analog input signal level and the reference level signal are compared with each other on a parallel basis.

For purposes of illustration let us take the level comparator circuit $10_2$ as an example. An analog switch 11 is first set to the "on" state by a pair of clock pulses $\phi_1$ and $\phi_2$, with the result that short-circuiting occurs between the input and output ends of an inverter 12. Thus, the operating point of this inverter is determined. At the same time, an analog switch 13, which is supplied at its input end with a reference level signal, is also set to the "on" state by the same pair of clock pulses $\phi_1$ and $\phi_2$, whereby the reference level signal is supplied to one end of a coupling capacitor 14. At this time, the level at one end of the coupling capacitor 14 is set to the reference level while the level at the other end of this coupling capacitor is set to the level at the operating point of the inverter 12, for example, the level equal to one half of the level of a power source voltage supplied to the inverter 12. At the next time sequence, another analog switch 15 is set to the "on" state by a pair of clock pulses $\phi_3$ and $\phi_4$, with the result that the analog input signal level is supplied to one end of the coupling capacitor 14. At this time, the level at the other end of the coupling capacitor becomes equal to a level which is deviated by the difference between the reference level and the analog input signal level from the level at the operating point of the inverter 12. And the level corresponding to this deviation is inverted and amplified by the inverter 12. The output of the inverter 12 is subjected to a shaping of the waveform by another inverter 16, and from this inverter 16 the result of the comparison between the reference level and the analog input signal level is outputted as a digital value of "1" level or "0" level. Another analog switch 17 is next set to the "on" state by another pair of clock pulses $\phi_5$ and $\phi_6$, whereby said result of comparison is supplied to the input end of an inverter 18 in which the level thereof is inverted. Next, during the period of inversion of the paired clock pulses $\phi_5$ and $\phi_6$, a clocked inverter 19 connected to the inverter 18 in the form of an antiparallel connection is rendered operative. Thus, the output of the inverter 18 is inverted by this clocked inverter 19 and is fed back to the input end of the inverter 18. Accordingly, the result of comparison supplied to the inverter 18 through the analog switch 17 is stable held, during the one-bit period of the clock pulses $\phi_5$ and $\phi_6$, by a stabilizer circuit 20 comprised of the inverter 18 and the clocked inverter 19.

In the level comparator circuit 10 which is supplied with the reference level higher than the analog input signal level, the input signal level of the inverter 12 after the analog switch 15 is turned "on" becomes lower than the level at the operating point of that inverter, with the result that the output of the inverter 16 becomes "0" level, while the output of the stabilizer circuit 20 becomes "1" level. On the other hand, the output of the stabilizer circuit 20 in the level comparator circuit 10 supplied with reference level lower than the analog input signal level becomes "0" level. In this way, in said plurality of level comparator circuits $10_1$ to $10_i$, the reference signals of different levels are compared in level with the analog input signal on a parallel basis. Thus, the outputs of the level comparator circuits supplied with the reference levels higher than the analog input signal level all become "1" level, while the outputs of the level comparator circuits supplied with the reference levels lower than the analog input signal level all become "0" level.

The outputs of the above-mentioned level comparator circuits $10_1$ to $10_i$ are supplied to a digital signal generator circuit 30. This circuit 30 is a circuit which, in accordance with the output of the level comparator circuits $10_1$ to $10_i$, generates a digital signal of a plurality of bits corresponding to the analog input signal level. In FIG. 1, a digital signal generator circuit which generates a digital signal of 6 bits is shown. In this case, 64-level comparator circuits 10 are necessary. (that is, i=64.)

In the digital signal generator circuit 30, the outputs from the level comparator circuits $10_1$ to $10_i$ are respectively inverted by a plurality of inverters $31_1$ to $31_i$, the outputs of which are supplied to a plurality of NAND gates $32_1$ to $32_i$ at one input end thereof. The NAND gate $32_1$, which receives at one input end the output of the inverter $31_1$ for inverting the output of the level comparator circuit $10_1$ supplied with the highest reference level, is constantly supplied at the other input end with a power source voltage of positive polarity. Further, the outputs from the level comparator circuits $10_1$ to $10_{i-1}$, which are supplied with the reference levels adjacent to, but higher than, the reference levels supplied to the level comparator circuits $10_2$ to $10_i$, are directly supplied to the other input ends of the NAND gates $32_2$ to $32_i$. Further, the output of the level comparator circuit $10_i$ supplied with the lowest reference level is supplied to one input end of a separate NAND gate $32_{i+1}$, which is supplied at its other input end with the output of an inverter $31_{i+1}$ which is supplied with a ground voltage at all times.

The circuit consisting of one of the inverters $31_1$ to $31_i$ and a corresponding one of the NAND gates $32_1$ to $32_i$ is intended to detect whether or not the output levels of a corresponding level comparator circuit set consisting of two level comparator circuits $10_1$ and $10_2$, $10_2$ and $10_3$, ... or $10_{i-1}$ and $10_i$, respectively supplied with two adjacent reference levels, differ from each other. Where the output levels of two such level comparator circuits are equal to each other, the output of the corresponding NAND gate 32 becomes "1" level. Where those output levels differ from each other, the output of the corresponding NAND gate 32 becomes "0" level. Further, since the NAND gate $32_1$ is supplied, through the inverter $31_1$, with the output of the level comparator circuit $10_1$ and also supplied with a "1" level signal, this inverter $31_1$ and NAND gate $32_1$ constitute a detection circuit for detecting whether or not the output of a level comparator circuit, supplied with a reference level at all times higher than the analog input signal level, differs from the output of the level comparator circuit $10_1$. The output from the level comparator circuit $10_1$ is supplied through the inverter $31_1$ to one input terminal of the NAND gate $32_1$. A "1" level signal is supplied to the input terminal of the NAND gate $32_1$ at all times. Hence, the inverter $31_1$ and the NAND gate $32_1$ from a level comparator circuit which receives a reference level higher than the highest level that an analog input signal has which may be converted into a digital signal. The outputs of the NAND gates $32_1$ to $32_{i+1}$ are supplied to a plurality of control lines $33_1$ to $33_i$ arranged in a specified direction, respectively, and are inverted by a plurality of inverters $34_1$ to $34_{i+1}$, respectively. The outputs of the inverters $34_1$ to $34_{i+1}$ are supplied to a plurality of control lines $35_1$ to $35_{i+1}$ arranged in the same direction as the control lines $33_1$ to $33_{i+1}$, respectively. Six output lines 36 to 41 are so provided as to intersect the control lines $33_1$ to $33_i$ and $35_1$ to $35_{i+1}$. Between these output lines 36 to 41 and the point of application of the power source voltage or the point of ground potential, there are connected P channel MOS transistors 43 and N channel MOS transistors 42 whose gates are supplied selectively with the signals of the control lines $33_1$ to $33_i$ and $35_1$ to $35_{i+1}$, respectively. The MOS transistors 42 and the MOS transistors 43 are arranged in the form of a specified bit pattern, thereby constituting a programmable logic array (PLA). When these MOS transistors are selectively set to the "on" state in accordance with the signals of the control lines $33_1$ to $33_i$ and $35_1$ to $35_{i+1}$, a digital signal of six bits corresponding to the analog input signal IN is outputted from said six output lines 36 to 41. Further, an overflow line 44, which is set at "1" level when said analog input signal level is higher than the reference level supplied to the level comparator circuit $10_1$, is connected to the output end of the inverter $34_1$.

That is to say, in the A/D converter circuit having the foregoing construction, when the A/D converting operation is carried out once, all of the outputs of the level comparator circuits 10 supplied with the reference level higher than the analog input signal level become "1" level, and all of the outputs of the level comparator circuits 10 supplied with the reference level lower than the analog input signal level become "0" level. And the output level of the level comparator circuit or circuits whose outputs are varied from "1" level to "0" level are detected by the inverters $31_1$ to $31_{i+1}$ and the NAND gates $32_1$ to $32_{i+1}$ of the digital signal generator circuit 30. In accordance with the results of detection, the MOS transistors 42 and 43 operate selectively, thereby obtaining a digital signal.

In the prior art parallel A/D converter circuit having the foregoing construction, when the frequency of the clock pulses $\phi_1$ to $\phi_6$ for controlling the level comparator circuits $10_1$ to $10_i$ is increased by degrees, it is possible to increase the speed of A/D conversion. However, when the frequency of the clock pulses $\phi_1$ to $\phi_6$ is increased so highly that the operation speed of the level comparator circuits $10_1$ to $10_i$ reaches a critical operation limit, some of the level comparator circuits 10 will operate erroneously. The digital signal obtained at this time becomes inaccurate and, in addition, when this circuit is fabricated in an integrated circuit, the said critical operation limit varies due to the process of manufacture. For this fact, it is necessary to sort the manufactured integrated circuits so as to be guaranteed commerically to have a specified converting speed by measuring the upper limit speed of the respective circuits. In the prior art circuit, however, no signal is outputted which enables direct determination of whether or not there exists a level comparator circuit 10 performing erroneous operation. This necessitates making such a judgement by means of said digital signal of six bits.

Since high speed analog processing apparatus is required for making such a judgement by the said digital signal, the cost for the said sorting operation increases, which significantly increases the manufacturing cost of the circuit.

Further, since a high speed signal is used in performing the above-mentioned sorting operation by the use of the high speed analog processing apparatus, the presence of even a small capacitance would cause a delay in that high speed signal, thus failing to make a precise judgement. Actually, in performing the said sorting operation, it is necessary to connect a measuring lead to an electrode on the wafer or to conduct mutual wiring between the wafer and the analog processing apparatus. This causes the production of a stray capacitance. In the prior art circuit, therefore, it is impossible to measure the upper limit speed of each integrated circuit while it is in the form of a wafer.

Further, even after the circuit is made into a product, it is necessary to judge whether or not each level comparator circuit $10_1 \ldots$ or $10_i$ performs an erroneous operation, and this judgement cannot be easily made for the above-mentioned reasons.

SUMMARY OF THE INVENTION

If the analog-to-digital converter circuit is made in the form of an IC, the upper limit of its analog-to-digital conversion speed can be easily determined either upon completion of manufacture or during use, or even while the circuit is still on a wafer. Moreover, if the circuit is made in the form of an IC, its testing cost can be reduced. The object of the present invention is to provide a parallel analog-to-digital converter circuit which comprises an n number of level comparator means for comparing the level of an analog input signal with an n number of reference levels, a first output means for outputting a digital signal corresponding to the level of the analog input signal in accordance with the results of comparision achieved by the level comparator means, a plurality of detection means each for detecting a specified state of output signals from a specific set of an m number of level comparator means which receive consecutive reference levels, where m is less than n, and a second output means for outputting a digital signal corresponding to the number of sets of level comparator means whose output signals are detected by the detection means to be in the specified state. According to said number of sets it is easily determined whether or not the level comparator means are functioning correctly.

According to the present invention, there is provided a parallel analog-to-digital converter circuit which, when it is made into an integrated circuit, permits easy determination while still in the manufacturer's testing stage, of the upper limit of its converting speed and, in particular, enables this determination while it is in the form of wafer, and which is low in manufacturing cost.

According to another aspect of the present invention, there is provided a parallel analog-to-digital converter circuit which, when it is made into a product and actually used, enables easy determination as to whether or not it is operating erroneously.

DETAILED DESCRIPTION OF THE PREFERRED EMBODIMENTS

Figure 1A:
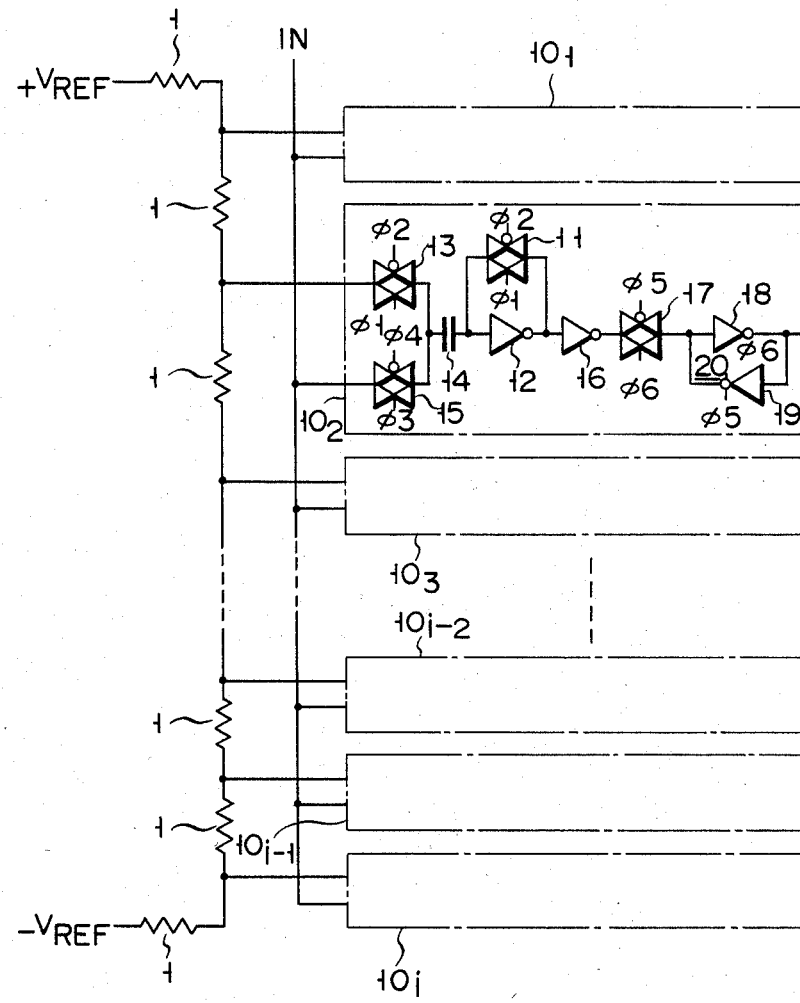
FIGS. 1A and 1B are views showing the construction of a prior art parallel analog-to-digital converter circuit.

Embodiments of the invention will now be explained with reference to the accompanying drawings. The analog-to-digital converter circuit according to the invention is based on the addition of a circuit having the construction shown in FIG. 2 to the above-mentioned prior art parallel analog-to-digital converter circuit shown in FIG. 1.

Figure 1B:
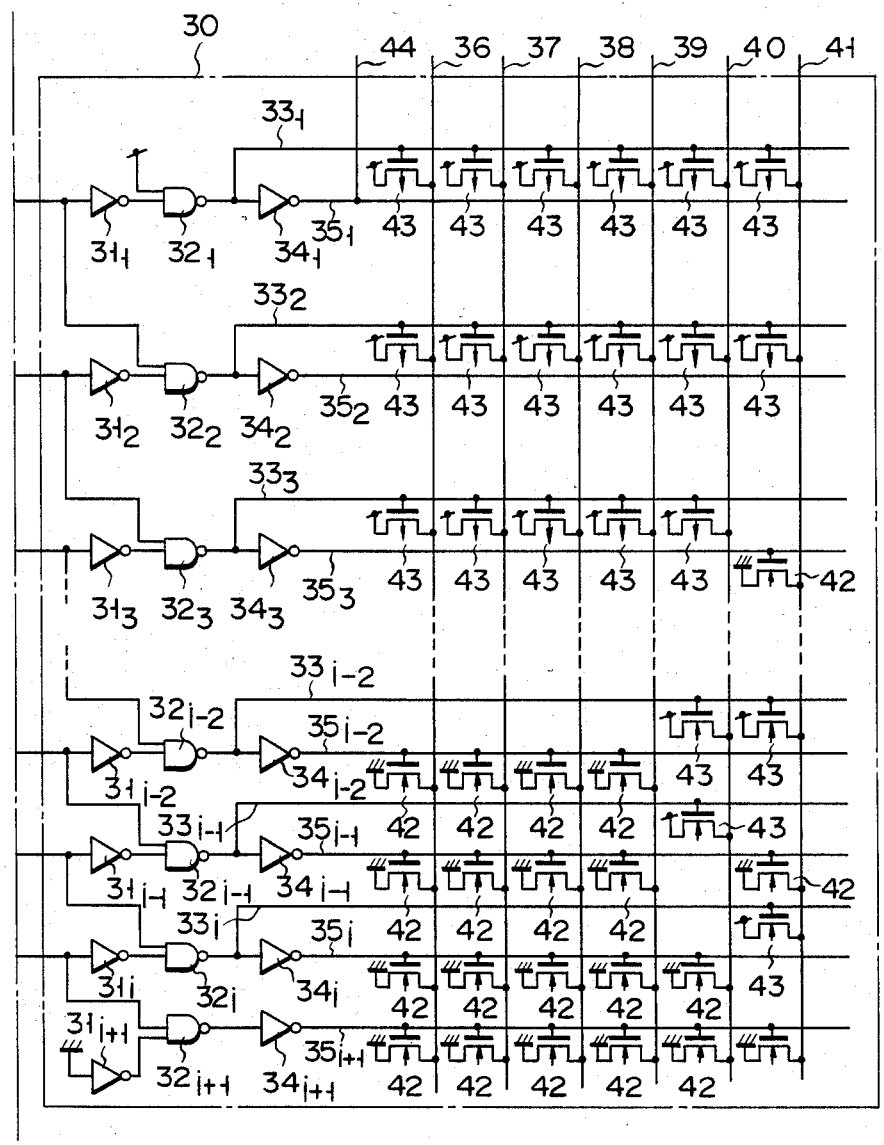
Figure 2:
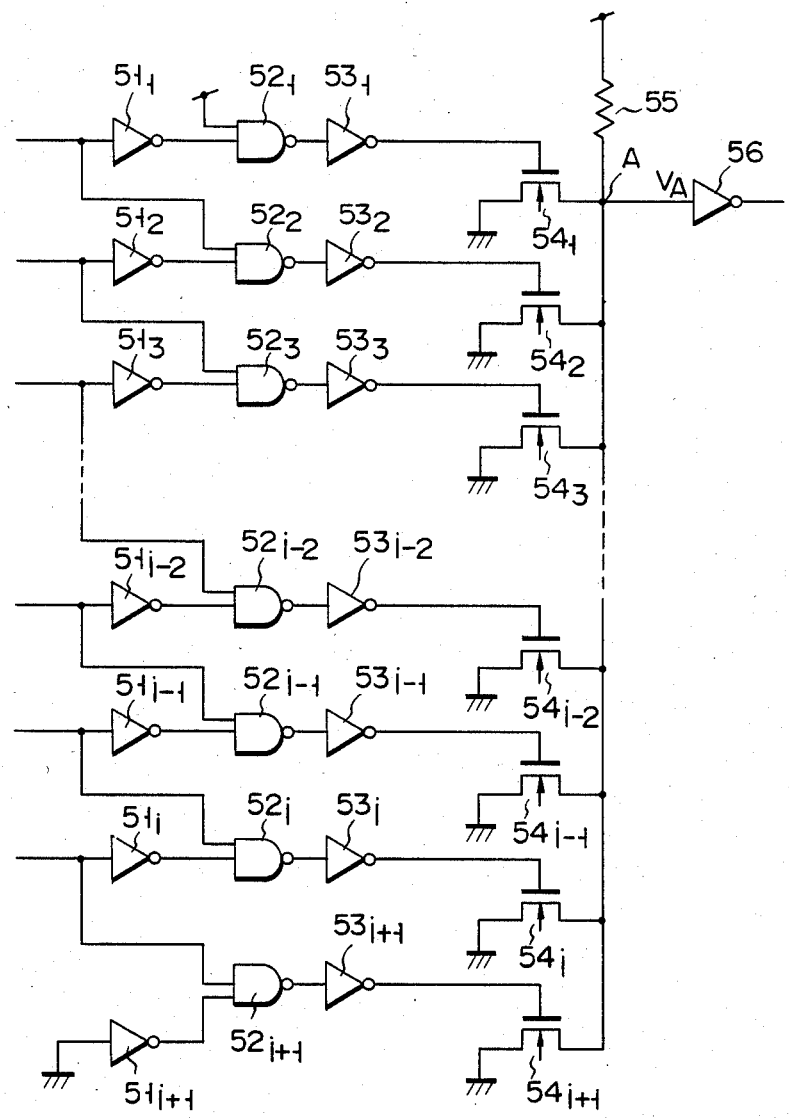
FIG. 2 is a view showing an analog-to-digital converter circuit according to an embodiment of the invention.

Referring to FIG. 2, a plurality of inverters $51_1$ to $51_i$ are supplied with the outputs from the above-mentioned level comparator circuits $10_1$ to $10_i$. The outputs of the inverters $51_1$ to $51_i$ are supplied to the input ends, at one side, of NAND gates $52_1$ to $52_i$. A power source voltage is supplied at all times to the other input end of the NAND gate $52_1$. Further, outputs from the level comparator circuits $10_1$ to $10_{i-1}$, which are supplied with reference levels adjacent to and higher than the reference levels supplied to the level comparator circuits $10_2$ to $10_i$, are directly supplied to the other input ends of the NAND gates $52_2$ to $52_i$. Further, the output from the level comparator circuit $10_i$, which is supplied with the lowest reference level, is supplied to one input end of another NAND gate $52_{i+1}$, the other input end of which is supplied with the output from an inverter $51_{i+1}$ which is supplied at all times with a ground voltage. The outputs of the NAND gates $52_1$ to $52_{i+1}$ are supplied, through a plurality of inverters $53_1$ to $53_{i+1}$, to the gates of a plurality of N channel MOS transistors $54_1$ to $54_{i+1}$, respectively. The sources of the MOS transistors $54_1$ to $54_{i+1}$ are connected to points of ground potential, respectively. The drains thereof are commonly connected, and, between the point A of common connection and the point of application of the power source voltage, there is connected a resistor 55 as a load means. An input end of an inverter 56 is connected to the point A to detect the level at that point A. The output of this inverter 56 is used as a signal for detecting the operational states of the level comparator circuits $10_1$ to $10_i$. Here it is to be noted that a gate comprised of the N channel MOS transistors $54_1$ to $54_{i+1}$ is substantially the same as an area associated with one output line of the programmable logic array (PLA) as shown in FIG. 1. In the integrated circuit, therefore, the gate comprised of the N-channel MOS transistors $54_1$ to $54_{i+1}$ can be readily formed by the same method as that of the programmable logic array (PLA).

In FIG. 2, the circuit consisting of one of the inverters $51_1$ to $51_{i+1}$ and a corresponding one of the NAND gates $52_1$ to $52_{i+1}$, like the circuit of FIG. 1 consisting of one of the inverters $32_1$ to $32_{i+1}$ and a corresponding one of the NAND gates $32_i$ to $32_{i+1}$, is used to detect whether or not the outputs of the level comparator circuits set $10_1$ and $10_2$, $10_3$ and $10_4$, . . . or $10_{1-1}$, each consisting of two level comparator circuits supplied respectively with two adjoining reference levels, differ from each other. A "0" level signal is outputted from the NAND gate 52 of the number corresponding to the number of said level comparator circuit sets in each of which the outputs have been detected to differ from each other.

In other words, the circuit consisting of one of the inverters $51_1$ to $51_{i+1}$ and a corresponding one of the NAND gates $52_1$ to $52_{i+1}$ is used to detect the state wherein the analog input signal level falls within the range of two reference levels supplied to the level comparator circuits of a corresponding set, or the case where the input side of the level comparator circuit, when seen from the output side thereof, is in a state equivalent to that in which the analog input signal level falls within the range of two reference levels supplied to the level comparator circuits of that corresponding set.

Further, the value of the resistor 55 is set beforehand such that, when one of said plurality of MOS transistors $54_1$ to $54_{i+1}$ is kept "on", the level $V_A$ at the point A is regarded as a "1" level input by the inverter 56, and when two or more of said plurality of MOS transistors $54_1$ to $54_{i+1}$ are turned "on", the level $V_A$ at the point A is regarded as a "0" level input by the inverter 56. That is to say, the out state of the inverter 56 is set in correspondence to the number of the NAND gates 52 whose outputs become "0" level.

The action of the circuit having the foregoing construction will now be described. When, in the circuit of FIG. 1, it is now assumed that all of the level comparator circuits $10_1$ to $10_{i+1}$ operate normally, the input signals of the inverters $51_1$ to $51_i$ in FIG. 2 at first continue to have "1" level in regard to several input signals and then as a whole have "0" level in regard to the remaining input signals. Assume that the input signals of the inverters $51_1$ to $51_{i-2}$, for example, each have "1" level and the input signals of the remaining inverters $51_{i-1}$ and $51_i$ have "0" level. Then only the output of the NAND gate $52_{i-1}$ has "0" level and all of the outputs of the remaining NAND gates $52_1$ to $52_{i-1}$, $52_i$ and $52_{i+1}$ have "1" level. Thus, the output of only one inverter $53_{i-1}$ is allowed to have high level, with the result that one MOS transistor $54_{i-1}$ is turned "on". Thus, the level $V_A$ at the point A decreases to a level lower than the power source voltage, with the result that the output of the inverter 56 has a "0" level.

At this time, in the circuit of FIG. 1, the output of the NAND gate $32_{i-1}$ corresponding to the NAND gate $52_{i-1}$ contained in the circuit of FIG. 2 has a "0" level and the output of the subsequent inverter $34_{i-1}$ has a "1" level. At this time, both the P channel MOS transistor 43, having its gate connected to the control line $33_{i-1}$ which is in turn connected to the NAND gate $32_{i-1}$, and the N channel MOS transistor 42, having its gate connected to the control line $35_{i-1}$ which is in turn connected to the inverter $34_{i-1}$, are turned "on". As a result, the output line 40 is set at "1" level and the output lines 36 to 39 and 41 are set at "0" level. At this stage of operation, therefore, a 6-bit digital signal of "0, 0, 0, 0, 1, 0" arranged from the upper order bit to the lower is obtained corresponding to the analog input signal IN.

On the other hand, in the circuit of FIG. 1, when one level comparator circuit 10 performs an erroneous operation, for example where the level comparator circuit $10_2$ performs an erroneous operation and as a result the input signal of the inverter $51_2$ has "0" level when, as in the above-mentioned normal operation, the input signals of the inverters $51_1$ to $51_{i-2}$ should all have "1" level and both the input signals of the inverters $51_{i-1}$ and $51_i$ should have "0" level, the inverter $53_2$ has a "1" level output as well as the inverter $53_{i-1}$. Thus, the two MOS transistors $54_2$ and $54_{i-1}$ are simultaneously turned "on" and, at this time, the output of the inverter 56 has "1" level. At this time, in the circuit of FIG. 1, in addition to the P channel MOS transistors 43 and the N channel MOS transistors 42, having their gates connected to said control lines $33_{i-1}$ and $35_{i-1}$, respectively, the P channel MOS transistors 43 having their gates connected to the control line $33_2$ are newly turned "on". Therefore, there is no guarantee that, in this case, the same signal as the above-mentioned 6-bit digital signal will be obtained from the output lines 36 to 41. Further, in the circuit of FIG. 1, where at least one level comparator circuit 10 operates erroneously, two or more of the MOS transistors $54_1$ to $54_{i+1}$ are simultaneously turned "on", with the result that the output of the inverter 56 comes to have a "1" level.

Accordingly, when it is desired to judge whether or not the level comparator circuit 10 involves an erroneous operation, it is sufficient to examine the output of the inverter 56. For this reason, when, after this circuit is made into an integrated circuit, it will be necessary to measure the upper limit speed of the respective circuits, thereby to sort the circuit having a specified converting circuit. It is sufficient, as mentioned above, to examine whether the output of the inverter 56 has "1" level or "0" level. In the present invention, therefore, the provision of the high speed analog processing apparatus required for the prior art analog-to-digital converter circuit is not required. As a consequence, the cost of the said sorting operation decreases, resulting in a large decrease in the manufacturing cost of the present analog-to-digital converter circuit.

Further, when the said sorting operation is carried out, it is sufficient to confirm a digital value outputted from the inverter 56 through the respective circuits involved. Thus, it is possible to measure the upper speed limit of each circuit when it is in the form of wafer. Further, even after the circuit is made into a product, examining the output of the inverter 56 enables easy judgement as to whether or not the relevant level comparator circuit 10 involves an erroneous operation.

It is to be noted here the since, in FIG. 2, the circuit consisting of inverters $51_1$ to $51_{i+1}$, NAND gates $52_1$ to $52_{i+1}$, and inverters $53_1$ to $53_{i+1}$ has the same construction as that of the circuit of FIG. 1 consisting of inverters $31_1$ to $31_{i+1}$, NAND gates $32_1$ to $32_{i+1}$ and inverters $34_1$ to $34_{i+1}$, the construction may also be arranged such that the output of the inverters $34_1$ to $34_{i+1}$ involved in the circuit of FIG. 1 is supplied to the gate of the MOS transistors $54_1$ to $54_{i+1}$ involved in the circuit of FIG. 2.

Figure 3:
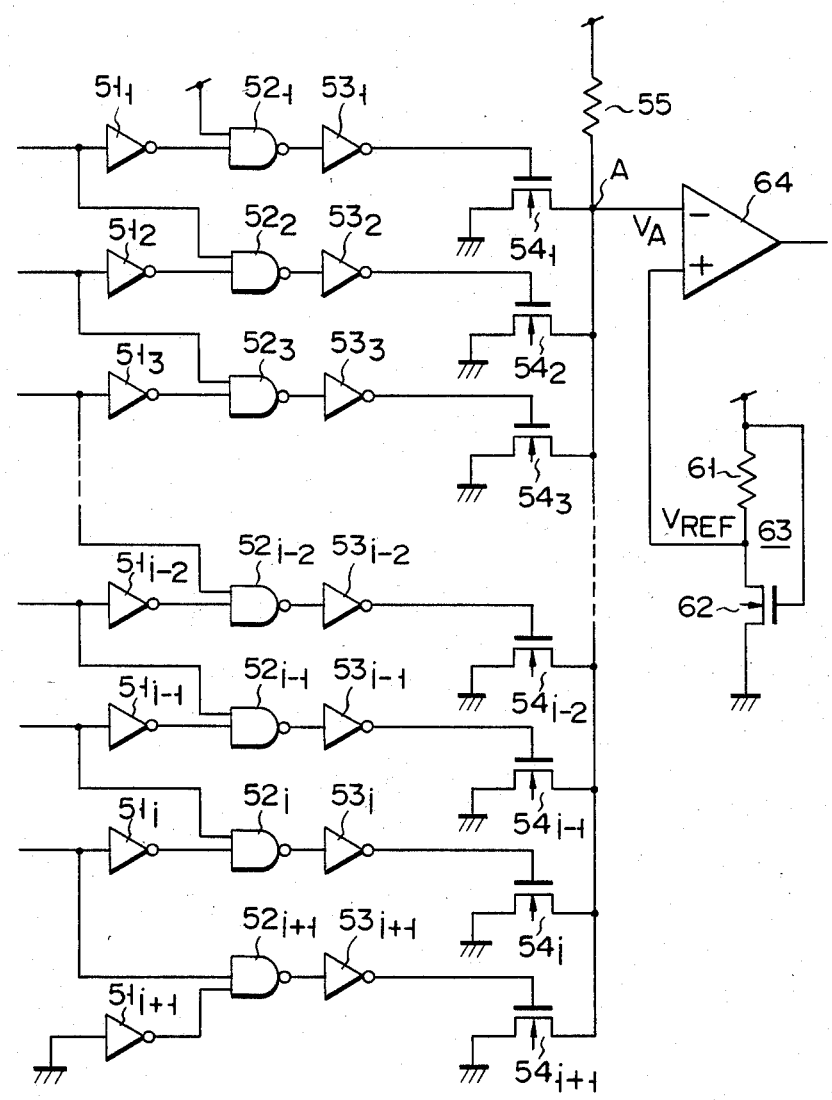
FIG. 3 is a view showing the analog-to-digital converter circuit according to another embodiment of the invention.

FIG. 3 is a circuit diagram showing the analog-to-digital converter circuit according to another embodiment of the invention, the construction of which corresponding to that of the circuit of FIG. 2.

In this embodiment, a specified-level generator circuit 63 consisting of a resistor 61 and an N channel MOS transistor 62 and adapted to generate a specified level of voltage $V_{REF}$ and a comparator 64 for comparing the level $V_{REF}$ with the level $V_A$ at the point A are used as a detection means for detecting the level $V_A$ at the point A. Said specified level $V_{REF}$ is set to a value lower than the level $V_A$ obtained when one of the plurality of MOS transistors $54_1$ to $54_{i+1}$ is turned "on" and is higher than the level obtained when two or more of such MOS transistors are turned "on". An autozero type comparator as shown, for example, in FIG. 1 may be used as the comparator 64.

It is to be noted here that, also in the circuit shown in this second embodiment, the outputs of the plurality of inverters $34_1$ to $34_{i+1}$ involved in the circuit of FIG. 1 may be adapted to be supplied to the gates of the plurality of MOS transistors $54_1$ to $54_{i+1}$, in which case, the inverters $51_1$ to $51_{i+1}$, NAND gates $52_1$ to $52_{i+1}$ and inverters $53_1$ to $53_{i+1}$ may be omitted.

Figure 4:
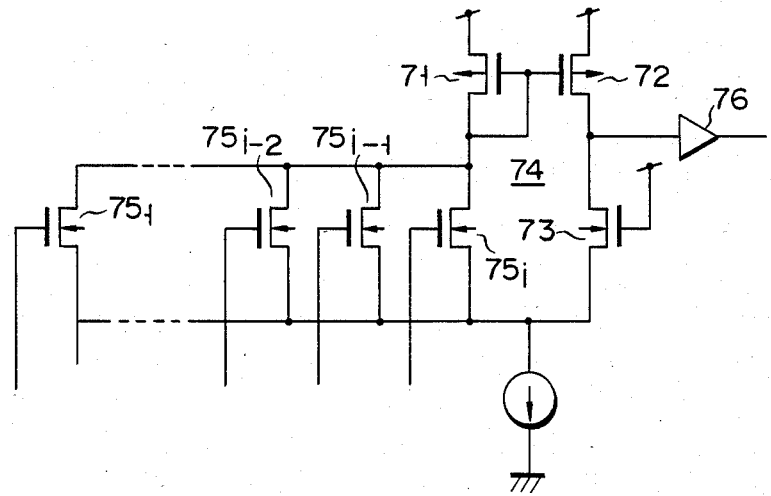
FIG. 4 is a view showing the analog-to-digital converter circuit according to still another embodiment of the invention.

FIG. 4 is a circuit diagram showing the analog-to-digital converter circuit according to still another embodiment of the invention. In this circuit, a differential amplifier 74 is employed which uses P channel MOS transistors 71 and 72 as the load MOS transistors and which uses, as one side drive MOS transistor, an N channel MOS transistor 73 having its gate supplied with a power source voltage and thus kept "on", and which also uses, as the other side drive MOS transistors, a plurality of N channel MOS transistors $75_1$ to $75_{i+1}$ connected in parallel to each other and having their gates supplied with the outputs of the plurality of inverters $34_1$ to $34_{i+1}$ or inverters $53_1$ to $53_{i+1}$, respectively, whereby the level at the point of connection between the MOS transistors 72 and 73 is detected by a buffer circuit 76. If we now assume that the gm value of one N channel MOS transistor 75 is represented by gmx, and the gm value of the N channel MOS transistor 73 by gms, each gm value is set such that the relation $gm < gms < 2\ gmx$ is established.

In this circuit, when one of the plurality of MOS transistors $75_1$ to $75_{i+1}$ is turned "on", more current will flow into the MOS transistor 73. As a result, the level at the point of connection between the MOS transistors 72 and 73 becomes approximately equal to the ground level. Thus, the output of the buffer circuit for detecting this level becomes zero level. On the other hand, when two or more of the MOS transistors $75_1$ to $75_{i+1}$ are turned "on", less current will flow into the MOS transistor 73. In this case, the level at the point of connection between the MOS transistors 72 and 73 becomes close to the power source level. Thus, the output of the buffer circuit 76 is inverted to a "1" level.

In this way, in the preceding embodiments, the initial purpose of the invention is achieved by adding any one of the erroneous-operation detection circuits shown in FIGS. 2 to 4 to the parallel analog-to-digital converter circuit shown in FIG. 1.

The present invention is not limited to the above-mentioned embodiments but permits various modifications. For example, in the embodiments described above, the level comparator circuit 10 produces a "1"

level signal when the reference level supplied thereto is higher than the analog input signal level; however, in another configuration the level comparator circuit 10 may produce a signal of opposite level to the "1" level signal. And in this case, the output of the circuit section corresponding to the level comparator circuit 10 whose output has been changed from the "0" level to the "1" level may be detected, thereby obtaining a digital signal indicating whether or not an erroneous operation is performed, in correspondence with the number of outputs so detected.

Further, in the preceding embodiments, reference was made to the case where a circuit consisting of one of the inverters $51_1$ to $51_{i+1}$ and a corresponding one of the two-input NAND gates $52_1$ to $52_{i+1}$ detects whether or not the outputs of the relevant level comparator circuit set consisting of two said level comparator circuits respectively supplied with two adjoining reference levels differ from each other, thereby driving the MOS transistors $54_1$ to $51_{i+1}$ in accordance with the results of that detection. In other words, this operation aim can also be realized simply by detecting a specified state of the outputs of several level comparator circuits when the analog input signal level falls within the range of several reference levels involved, or when, due to the erroneous operation of the level comparator circuit 10, the operation is in a state equivalent to that in which the analog input signal level falls within the range of said several reference levels, and by turning on the MOS transistors 54 in a number corresponding to the number of the level comparator circuits having been detected to be in such a specified output state.

Referring to FIG. 2, the output signals of the level comparators $10_1, 10_2, 10_3, \ldots 10_{i-2}, 10_{i-1}$ and $10_i$ (FIG. 1A) are supplied to the inverters $51_1, 51_2, 51_3 \ldots 51_{i-2}, 51_{i-1}$ and $51_i$. The input of the inverter $51_{i+1}$ is coupled to ground. In the embodiment of FIG. 2, 2-input NAND gates $51_1, 52_2, 52_3 \ldots 52_{i-2}, 52_{i-1}$ and $52_i$ are used to detect a particular combination of binary values of the output signals of the comparators $10_1, 10_2, 10_3, \ldots 10_{i-2}, 10_{i-1}$ and $10_i$. Instead, 3-input NAND gates may be used for the same purpose.

Figure 5:
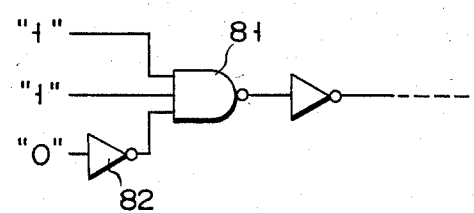
FIG. 5 is a view showing the analog-to-digital converter circuit according to a further embodiment of the invention.

When 3-input NAND gates are used, it is advisable to use the combination of the inverter 82 and 3-input type NAND gate 81 shown in FIG. 5, instead of the combination of the inverter 51 and 2-input type NAND gate 52 shown in FIG. 2. In this case, the signals supplied to the inverters $51_1, 51_2, 51_3, \ldots 51_{i-2}, 51_{i-1}, 51_i$ and $51_{i+1}$ are grouped into groups of three (as $51_1, 51_2, 51_3$) $\ldots (51_{i-2}, 51_{i-1}, 51_i), (51_{i-1}, 51_i, 51_{i+1})$. As shown in FIG. 5, of the output signals of the three comparators 10 forming one group of three which were supplied to three inverters 51 in FIG. 2, the output signal having the lowest reference level is supplied to one input of a 3-input NAND gate 81 through an inverter 82. The output signals of the other two comparators 10, having the highest and the medium reference levels, are supplied directly to the remaining two input terminals of a NAND gate 81.

The outputs of the 3-input NAND gates are connected to the input terminals of the inverters $53_1$ to $53_{j+1}$, in place of the output terminals of the 2-input NAND gates $52_1$ to $52_{j+1}$ of FIG. 2. Therefore, when the 2-input NAND gates $52_1$ to $52_{j+1}$ of FIG. 2 are replaced by the 3-input NAND gates of FIG. 5, it is possible to omit both the inverters $51_1$ to $51_{j+1}$ and the 2-input NAND gates $52_1$ to $51_{j+1}$, shown in FIG. 2.

In this case, the outputs from the three level comparator circuits 10 have "1", "1" and "0" levels and are thus in the specified state. An inverter 82 is connected between the circuit 10 producing an output of a "0" level and the third input terminal of the NAND gate 81. Then, the NAND gate 81 produces an output of "0" level only when the outputs from the three level comparator circuits 10 are in the specified state. Therefore, one of the MOS transistors $54_1$ to $54_{i+1}$ may be controlled according to the output from the NAND gate 81.

Further, the construction of the digital signal generator circuit 30 is also not limited to that shown in FIG. 1, but may, for example, have 3-input NAND gates used in place of the 2-input NAND gates $32_1$ to $32_{i+1}$.

What we claim is:

1. A parallel analog-to-digital converter circuit comprising:

an n number of level comparator means for comparing the level of an analog input signal with an n number of reference levels;

a first output means for outputting a digital signal corresponding to the level of said analog input signal in accordance with results of a comparison achieved by the level comparator means;

a plurality of detection means each for detecting a specified state of output signals from a set of an m number of level comparator means which receive consecutive reference levels, where m is less than n;

a second output means for outputting digital signals corresponding to the number of sets of level comparator means whose output signals are detected by the detection means to be in the specified state; wherein each of said detection means is a three-input NAND gate, two input terminals of which are connected to the output terminals of two level comparator means, and the third input terminal of which is connected the output of a third level comparator means through an inverter, said three level comparator means forming a set, and the output signals from these three level comparator means are detected to be in a specified state when they have logic levels "1", "1" and "0", respectively.

* * * * *